United States Patent
Taniguchi et al.

(10) Patent No.: US 7,616,981 B2
(45) Date of Patent: Nov. 10, 2009

(54) INSPECTION APPARATUS USING NUCLEAR MAGNETIC RESONANCE

(75) Inventors: Yo Taniguchi, Kokubunji (JP); Hisaaki Ochi, Kodaira (JP); Shinichiro Umemura, Hachiouji (JP)

(73) Assignee: Hitachi Medical Corporation, Tokyo (JP)

( * ) Notice: Subject to any disclaimer, the term of this patent is extended or adjusted under 35 U.S.C. 154(b) by 674 days.

(21) Appl. No.: 10/614,019

(22) Filed: Jul. 8, 2003

(65) Prior Publication Data

US 2004/0133096 A1    Jul. 8, 2004

(30) Foreign Application Priority Data

Jan. 7, 2003    (JP) .............................. 2003-001271

(51) Int. Cl.
*A61B 5/05* (2006.01)

(52) U.S. Cl. ......................... 600/410; 600/413; 600/407

(58) Field of Classification Search ................ 600/413, 600/410, 411, 407; 324/307, 309; 382/278
See application file for complete search history.

(56) References Cited

U.S. PATENT DOCUMENTS

| | | | |
|---|---|---|---|
| 4,905,699 A | 3/1990 | Sano et al. | |
| 5,363,844 A | 11/1994 | Riederer et al. | |
| 5,479,537 A * | 12/1995 | Hamashima et al. | 382/266 |
| 5,668,474 A * | 9/1997 | Heid | 324/309 |
| 5,977,769 A | 11/1999 | Bornert et al. | |
| 6,292,684 B1 | 9/2001 | Du et al. | |
| 6,687,528 B2 * | 2/2004 | Gupta et al. | 600/410 |
| 6,980,846 B2 * | 12/2005 | Hardy et al. | 600/410 |

FOREIGN PATENT DOCUMENTS

| | | |
|---|---|---|
| EP | 0 793 113 A1 | 9/1997 |
| JP | 63-164943 | 7/1988 |
| JP | 11-128202 | 5/1999 |
| JP | 2001-204712 | 7/2001 |
| WO | WO 90/05920 | 5/1990 |
| WO | WO 01/84173 | 11/2001 |

OTHER PUBLICATIONS

"NMR Igaku-Kiso to Rinsho", published by Maruzen, 1991, pp. 144-145 → An imaging by ECG gating is described in this document.
United States Patent No. 5,363,844.

* cited by examiner

*Primary Examiner*—Long V Le
*Assistant Examiner*—Jacqueline Cheng
(74) *Attorney, Agent, or Firm*—Antonelli, Terry, Stout & Kraus, LLP.

(57) ABSTRACT

There is provided an inspection apparatus using nuclear magnetic resonance which can execute multi-slice and multi-frame cardiac imaging of a heart without giving any load on a subject. An inspection apparatus using nuclear magnetic resonance has static magnetic field generation means generating a static magnetic field; magnetic field gradient generation means generating a magnetic field gradient in a first, a second and a third directions orthogonal to each other; radiofrequency magnetic field generation means generating a radiofrequency magnetic field; signal detection means detecting a nuclear magnetic resonance signal (echo) produced from a subject; arithmetic processing means performing arithmetic processing of the detected nuclear magnetic resonance signal; and control means controlling the magnetic field gradient generation means and the radiofrequency magnetic field generation means, wherein the control means executes a pulse sequence acquiring a projection to determine a similarity coefficient between the projection and a reference projection, thereby detecting respiratory motion of the subject.

12 Claims, 9 Drawing Sheets

FIG. 6(A)   FIG. 6(B)
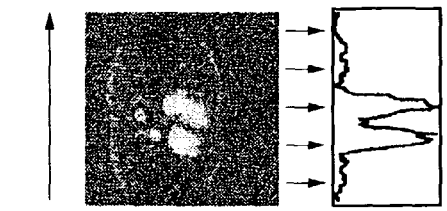
FIG. 6(C)
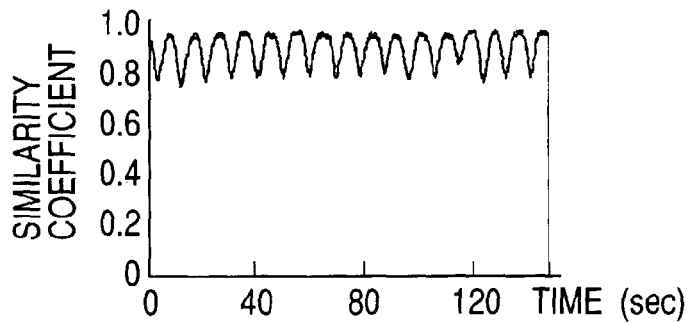
FIG. 7
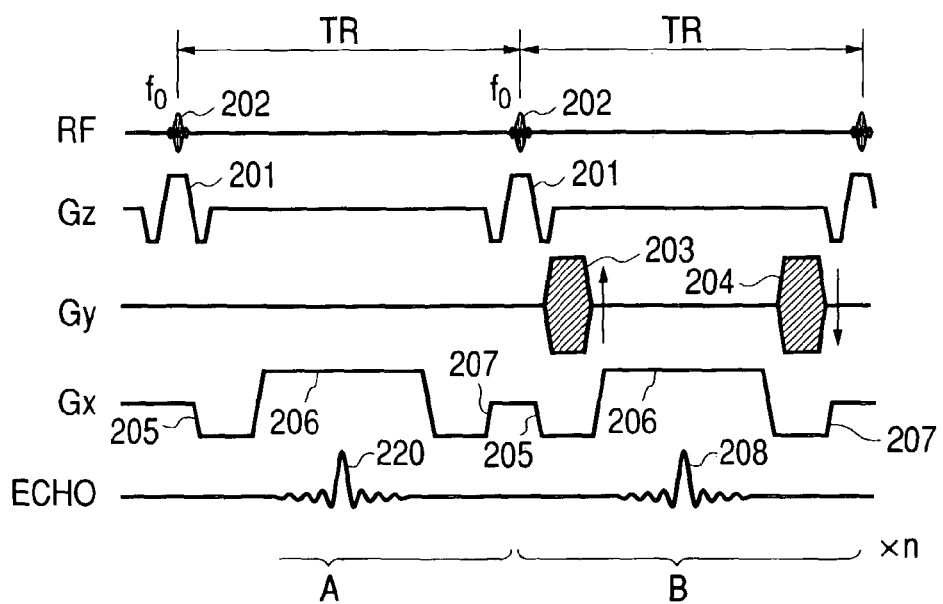

(LOWER IMAGES ARE ENHANCED THEIR IMAGE CONTRAST)

INSPECTION APPARATUS USING NUCLEAR MAGNETIC RESONANCE

BACKGROUND OF THE INVENTION

The present invention relates to an inspection apparatus using nuclear magnetic resonance for acquiring echoes while monitoring motion of a subject using a nuclear magnetic resonance signal.

A nuclear magnetic resonance imaging (MRI) apparatus is a medical image diagnosis apparatus which generates nuclear magnetic resonance in a hydrogen atomic nucleus in an arbitrary plane across a subject to acquire a tomographic image in the plane from a nuclear magnetic resonance signal produced.

In general, a slice select magnetic field gradient specifying a plane to acquire a tomographic image of a subject is applied, and at the same time, an excitation pulse exciting spins in the plane is given, so as to acquire a nuclear magnetic resonance signal (echo) produced in the stage that the spins excited is refocused. To give position information to the spins, a phase-encoding magnetic field gradient and a readout magnetic field gradient in the direction vertical to each other in a transverse section are applied during the period between the excitation and the echo acquisition. The measured echo is arranged in a k-space in which the horizontal axis is kx and the vertical axis is ky. One echo occupies one line parallel to the kx axis. The k-space is inverse Fourier transformed to perform image reconstruction.

The pulse and the magnetic field gradient for producing an echo are applied based on a predetermined pulse sequence. Various types of the pulse sequence are known according to an object.

For example, a gradient-echo (GE) method, one of general echo-acquiring methods, is a method which repeatedly operates its pulse sequence to sequentially change a phase-encoding magnetic field gradient for each repetition, thereby successively measuring the number of echoes necessary for acquiring one tomographic image.

FIG. 1(A) shows a pulse sequence of the GE method. The operation of the pulse sequence is as follows. A slice select magnetic field gradient pulse 201 in z direction is applied. At the same time, a radiofrequency magnetic field (RF) pulse 202 for spin excitation having resonance frequency $f_0$ of a proton is applied. A nuclear magnetic resonance phenomenon is induced in the proton of a certain slice in a subject. A phase-encoding magnetic field gradient pulse 203 for adding position information in a phase-encoding direction (y) to the phase of spin and a readout magnetic fields gradient 205 for dephase are applied. While applying a readout magnetic field gradient pulse 206 for adding position information in a readout direction (x), a nuclear magnetic resonance signal (echo) 208 is measured. After the echo measurement, a re-phase magnetic field gradient pulse 207 is applied to return the phase of the spin for the next excitation.

The procedure from the slice select magnetic field gradient pulse application to the echo measurement is repeated in repetition time TR to measure echoes necessary for acquiring one image. The echoes are arranged on a k-space 209, as shown in FIG. 1(B), for image reconstruction by two-dimensional inverse Fourier transform. The echo-acquiring time per image is 1.28 seconds when at TR of 10 ms, an image of 128×128 pixels is acquired. The TR of the sequence is short. The sequence must be executed above about 20 times until the spin is in a steady state so that the echoes are stable.

In the case of cardiac imaging, since a cardiac cycle is about one second which is shorter than the imaging time, ECG gating is widely used to improve the time resolution (for example, see "NMR Igaku-Kiso to Rinsho", published by Maruzen, 1991, pp. 144 to 145). This method is a method which changes phase encoding in synchronization with a trigger of R wave of an ECG to measure echoes necessary for reconstruction of one image across plural heartbeats. When respiratory motion occurs during echo-acquiring, a ghost is caused in the reconstructed image. Echo-acquiring is generally done during breath-hold.

As an example thereof, FIG. 2(A) shows the relation between an ECG and measurement when an image of 128× 128 pixels is acquired with 8 frames per heartbeat and TR of 5 ms. First, phase encoding is changed by 8 immediately after R wave T1 to perform measurement from −64 to 56. This is repeated for 8 frames 8 times. Then, the phase encoding is also changed by 8 immediately after R wave T2 to perform measurement from −63 to 57. This is repeated for 8 frames 8 times. The above measurement is continuously performed to T8. As shown in FIG. 2(B), the echo 208 is rearranged for each of the frames in order of phase encoding to be arranged on the k-space 209 for reconstruction.

There is proposed a method for monitoring breathing using a nuclear magnetic resonance signal. This is a method for detecting motion of the boundary (diaphragm) between a liver and a lung from a one-dimensional projection in an area excited in a rod form from the liver to the lung (see U.S. Pat. No. 5,363,844).

In the prior art method for using ECG gating to enhance the time resolution of echo-acquiring, the echo-acquiring time of one image is about 8 seconds for 8 heartbeats. The breath-holding time of a health person is up to about 30 seconds. The number of slices which can be echo-acquired with one breath-hold is about 4 at most. When echo-acquiring the number of slices larger than that, breath-hold must be done plural times. This puts a significant load on a subject.

In the prior art method for monitoring breathing using a nuclear magnetic resonance signal, an echo-acquired section and an excitation area for breathing monitoring are different. Each time breathing monitoring is executed, an extra sequence for returning spin to a steady state must be executed. The echo-acquiring time is longer.

In the prior art, a heart is echo-acquired by ECG gating. An ECG must be worn on a subject.

SUMMARY OF THE INVENTION

An object of the present invention is to provide an inspection apparatus using nuclear magnetic resonance which can execute multi-slice and multi-frame imaging of a heart without giving any load on a subject.

To achieve the above object, an inspection apparatus using nuclear magnetic resonance according to the present invention has static magnetic field generation means generating a static magnetic field; magnetic field gradient generation means generating magnetic field gradients in a first, a second and a third directions orthogonal to each other; radiofrequency magnetic field generation means generating a radiofrequency magnetic field; signal detection means detecting a nuclear magnetic resonance signal (echo) produced from a subject (living body); arithmetic processing means performing arithmetic processing of the detected nuclear magnetic resonance signal; and control means controlling the magnetic field gradient generation means and the radiofrequency magnetic field generation means, wherein the control means executes a pulse sequence acquiring a projection to determine a similarity coefficient between the projection and a reference projection, thereby detecting respiratory motion of the subject.

The control means executes a pulse sequence giving phase encoding to measure an echo while changing the magnitude of the phase encoding for acquiring a tomographic image, acquires the reference projection before executing the pulse sequence, and acquires the projection during execution of the pulse sequence, thereby acquiring an image without the influence of respiratory motion.

An inspection method using nuclear magnetic resonance according to the present invention has the following features.

1) An inspection method using nuclear magnetic resonance having the steps of applying a radiofrequency magnetic field and a magnetic field gradient to a living body placed in a static magnetic field to detect a nuclear magnetic resonance signal produced from the living body and using the detected nuclear magnetic resonance signal to perform image reconstruction of an imaging section, has the steps of: (1) in the state that the living body stops exhalation or inspiration, executing a first pulse sequence detecting the nuclear magnetic resonance signal to acquire a reference projection of an imaging section as the reference of monitoring of respiratory motion of the living body; (2) in the state that the living body breathes, executing once the first pulse sequence detecting the nuclear magnetic resonance signal to acquire a projection of the imaging section used for the monitoring and in the state that the living body breathes, repeating a second pulse sequence detecting the nuclear magnetic resonance signal to acquire an image of the imaging section at predetermined repetition time intervals; and (3) collecting the nuclear magnetic resonance signals used for the image reconstruction in the second pulse sequence based on a similarity coefficient between the projection and the reference projection.

2) An inspection method using nuclear magnetic resonance having the steps of applying a radiofrequency magnetic field and a magnetic field gradient to a living body placed in a static magnetic field to detect a nuclear magnetic resonance signal produced from the living body and using the detected nuclear magnetic resonance signal to perform image reconstruction of an imaging section, has the steps of: (1) in the state that the living body stops exhalation or inspiration, executing a first pulse sequence detecting the nuclear magnetic resonance signal to acquire a reference projection of an imaging section as the reference of monitoring of respiratory motion of the living body; (2) in the state that the living body breathes, executing once the first pulse sequence detecting the nuclear magnetic resonance signal to acquire a projection of the imaging section used for the monitoring and in the state that the living body breathes, repeating a second pulse sequence detecting the nuclear magnetic resonance signal to acquire an image of the imaging section at predetermined repetition time intervals; (3) collecting the nuclear magnetic resonance signals used for the image reconstruction in the second pulse sequence by monitoring the motion based on a similarity coefficient between the projection and the reference projection; and (4) repeating the (2) to the (3).

3) An inspection method using nuclear magnetic resonance having the steps of applying a radiofrequency magnetic field and a magnetic field gradient to a living body placed in a static magnetic field to detect a nuclear magnetic resonance signal produced from the living body and using the detected nuclear magnetic resonance signal to perform image reconstruction of an imaging section, has the steps of: (1) in the state that the living body stops exhalation or inspiration, executing a first pulse sequence detecting the nuclear magnetic resonance signal to acquire a reference projection of the imaging section; (2) in the state that the living body breathes, executing once the first pulse sequence and in the state that the living body breathes, repeating a second pulse sequence detecting the nuclear magnetic resonance signal at predetermined repetition time intervals; (3) acquiring a projection of the imaging section from the nuclear magnetic resonance signal detected in the first pulse sequence of the (2); (4) determining a similarity coefficient between the projection and the reference projection; (5) monitoring respiratory motion of the living body based on the similarity coefficient; (6) collecting the nuclear magnetic resonance signals used for the image reconstruction in the second pulse sequence according to the result of the monitoring; and (7) repeating the (2) to the (6).

4) The inspection method using nuclear magnetic resonance according to the 3), wherein in the (5), the motion is monitored based on comparison of a value of the similarity coefficient with a predetermined threshold value.

5) An inspection method using nuclear magnetic resonance having the steps of applying a radiofrequency magnetic field and a magnetic field gradient to a living body placed in a static magnetic field to detect a nuclear magnetic resonance signal produced from the living body and using the detected nuclear magnetic resonance signal to perform image reconstruction of an imaging section, has the steps of: (1) in the state that the living body stops exhalation or inspiration, executing a first pulse sequence detecting the nuclear magnetic resonance signal; (2) acquiring a reference projection of the imaging section from the nuclear magnetic resonance signal detected in the first pulse sequence; (3) in the state that the living body breathes, executing once the first pulse sequence and in the state that the living body breathes, repeating a second pulse sequence detecting the nuclear magnetic resonance signal at predetermined repetition time intervals; (4) acquiring a projection of the imaging section from the nuclear magnetic resonance signal detected in the first pulse sequence of the (3); (5) determining a similarity coefficient between the projection and the reference projection; (6) collecting the nuclear magnetic resonance signals used for the image reconstruction in the second pulse sequence based on comparison of a value of the similarity coefficient with a predetermined threshold value; and (7) repeating the (3) to the (6).

6) An inspection method using nuclear magnetic resonance having the steps of applying a radiofrequency magnetic field and a magnetic field gradient to a living body placed in a static magnetic field to detect a nuclear magnetic resonance signal produced from the living body and using the detected nuclear magnetic resonance signal to perform image reconstruction of an imaging section, has the steps of: (1) in the state that the living body stops exhalation or inspiration, executing a first pulse sequence detecting the nuclear magnetic resonance signal; (2) acquiring a reference projection of the imaging section from the nuclear magnetic resonance signal detected in the first pulse sequence; (3) in the state that the living body breathes, executing once the first pulse sequence and in the state that the living body breathes, repeating a second pulse sequence detecting the nuclear magnetic resonance signal at predetermined repetition time intervals; (4) acquiring a projection of the imaging section from the nuclear magnetic resonance signal detected in the first pulse sequence of the (3); (5) determining a similarity coefficient between the projection and the reference projection; (6) collecting the nuclear magnetic resonance signals used for the image reconstruction in the second pulse sequence based on the similarity coefficient; and (7) repeating the (3) to the (6).

7) An inspection method using nuclear magnetic resonance having the steps of applying a radiofrequency magnetic field and a magnetic field gradient to a living body placed in a static magnetic field to detect a nuclear magnetic resonance signal produced from the living body and using the detected nuclear magnetic resonance signal to perform image reconstruction of an imaging section, has the steps of: (1) in the state that the living body stops exhalation, executing a first pulse sequence detecting the nuclear magnetic resonance signal; (2) acquiring a reference projection of the imaging section from the nuclear magnetic resonance signal detected in the first pulse sequence; (3) in the state that the living body breathes, executing once the first pulse sequence and in the state that the living body breathes, repeating a second pulse sequence detecting the nuclear magnetic resonance signal at predetermined repetition time intervals; (4) acquiring a projection of the imaging section from the nuclear magnetic resonance signal detected in the first pulse sequence of the (3); (5) determining a similarity coefficient between the projection and the reference projection; (6) collecting the nuclear magnetic resonance signals used for the image reconstruction in the second pulse sequence when a value of the similarity coefficient is larger than a predetermined threshold value; and (7) repeating the (3) to the (6).

8) The inspection method using nuclear magnetic resonance according to the 7), wherein the first pulse sequence of the (1) is executed once.

9) The inspection method using nuclear magnetic resonance according to the 7), wherein the first pulse sequence of the (1) is repeated at the predetermined repetition time intervals, and an average of projections of the imaging section acquired from the nuclear magnetic resonance signals detected by repeating the first pulse sequence of the (1) is obtained as the reference projection.

10) The inspection method using nuclear magnetic resonance according to the 7), further has, between the (2) and the (3), the steps of: (a) in the state that the living body breathes, repeating the first pulse sequence at the predetermined repetition time intervals; (b) determining frequency of appearance of the similarity coefficient between a projection of the imaging section acquired from the nuclear magnetic resonance signals detected by repeating the first pulse sequence of the (a) and the reference projection; and (c) deciding, as the predetermined threshold value, the similarity coefficient in which the sum of the frequency of appearance in a part in which the similarity frequency is close to 1 is 1/m of the sum of the frequency of appearance where m is a positive number of 3 or above.

11) An inspection method using nuclear magnetic resonance having the steps of applying a radiofrequency magnetic field and a magnetic field gradient to a living body placed in a static magnetic field to detect a nuclear magnetic resonance signal produced from the living body and using the detected nuclear magnetic resonance signal to perform image reconstruction of an imaging section, has the steps of: (1) in the state that the living body stops exhalation, executing a first pulse sequence detecting the nuclear magnetic resonance signal; (2) acquiring a reference projection of the imaging section from the nuclear magnetic resonance signal detected in the first pulse sequence; (3) in the state that the living body breathes, repeating the first pulse sequence at predetermined repetition time intervals; (4) acquiring a projection of the imaging section from the nuclear magnetic resonance signal detected in the first pulse sequence of the (3); (5) determining a similarity coefficient between the projection and the reference projection; (6) determining a predetermined threshold value from frequency of appearance of the similarity coefficient; (7) in the state that the living body breathes, executing once the first pulse sequence and in the state that the living body breathes, repeating a second pulse sequence detecting the nuclear magnetic resonance signal at said predetermined repetition time intervals; (8) acquiring a projection of the imaging section from the nuclear magnetic resonance signal detected in the first pulse sequence of the (7); (9) determining the similarity coefficient between the projection of the (8) and the reference projection; (10) collecting the nuclear magnetic resonance signals used for the image reconstruction in the second pulse sequence when a value of the similarity coefficient of the (9) is larger than the predetermined threshold value; and (11) repeating the (7) to the (10).

12) The inspection method using nuclear magnetic resonance according to the 11), further has the step of deciding, as the predetermined threshold value, the similarity coefficient in which the sum of the frequency of appearance in a part in which the similarity frequency is close to 1 is 1/m of the sum of the frequency of appearance where m is a positive number of 3 or above.

13) An inspection method using nuclear magnetic resonance having the steps of applying a radiofrequency magnetic field and a magnetic field gradient to a living body placed in a static magnetic field to detect a nuclear magnetic resonance signal produced from the living body and using the detected nuclear magnetic resonance signal to perform image reconstruction of an imaging section, has the steps of: (1) in the state that the living body stops exhalation, executing a first pulse sequence having a first time section applying, to the living body, a slice select magnetic field gradient having a positive polarity and a radiofrequency magnetic field, a second time section applying, to the living body, a readout magnetic field gradient having a negative polarity, a third time section detecting the nuclear magnetic resonance signal in the state of applying the readout magnetic field gradient having a positive polarity, and a fourth time section applying, to the living body, the readout magnetic field gradient having a negative magnetic field; (2) one-dimensional inverse Fourier transforming the nuclear magnetic resonance signal detected in the first pulse sequence to acquire a reference projection of the imaging section in the direction applying the readout magnetic field gradient of the imaging section; (3) in the state that the living body breathes, executing once the first pulse sequence and in the state that the living body breathes, executing a second pulse sequence repeating, at predetermined repetition time intervals, a pulse sequence having a fifth time section applying, to the living body, the slice select magnetic field gradient having a positive polarity and the radiofrequency magnetic field, a sixth time section applying, to the living body, respective magnetic field gradients of a phase-encoding magnetic field gradient and a readout magnetic field gradient having a negative polarity, a seventh time section detecting the nuclear magnetic resonance signal in the state of applying the readout magnetic field gradient having a positive polarity, and an eighth time section applying, to the living body, the phase-encoding magnetic field gradient having the opposite polarity of the polarity of the phase-encoding magnetic field gradient applied in the second time section and the readout magnetic field gradient having a negative polarity, by changing the magnitude of the phase-encoding magnetic field gradient; (4) one-dimensional inverse Fourier transforming the nuclear magnetic resonance signal detected in the first pulse sequence of the (3) to acquire a projection in the direction applying the readout magnetic field gradient of the imaging section; (5) determining a similarity coefficient between the projection and the reference projection; (6) collecting the nuclear magnetic resonance signals used for the image reconstruction in the second pulse sequence based on comparison of a value of the similarity coefficient with a predetermined threshold value; and (7) repeating the (3) to the (6).

14) The inspection method using nuclear magnetic resonance according to the 13), further has the step of collecting the nuclear magnetic resonance signals used for the image reconstruction in the second pulse sequence when a value of the similarity coefficient is larger than a predetermined threshold value.

15) The inspection method using nuclear magnetic resonance according to the 13), further has the steps of: determining frequency of appearance of the similarity coefficient and deciding, as the predetermined threshold value, the similarity coefficient in which the sum of the frequency of appearance in a part in which the similarity frequency is close to 1 is 1/m of the sum of the frequency of appearance where m is a positive number of 3 or above.

16) The inspection method using nuclear magnetic resonance according to the 13), wherein the first pulse sequence of the (1) is executed once.

17) The inspection method using nuclear magnetic resonance according to the 13), further has the step of repeating the first pulse sequence of the (1) at the predetermined repetition time intervals, whereby an average of projections of the imaging section acquired from the nuclear magnetic resonance signals detected by repeating the first pulse sequence of the (1) is obtained as the reference projection.

18) An inspection method using nuclear magnetic resonance having the steps of applying a radiofrequency magnetic field and a magnetic field gradient to a living body placed in a static magnetic field to detect a nuclear magnetic resonance signal produced from the living body and using the detected nuclear magnetic resonance signal to perform image reconstruction of an imaging section, has the steps of: (1) in the state that the living body stops exhalation, executing a first pulse sequence having a first time section applying, to the living body, a slice select magnetic field gradient having a positive polarity and a radiofrequency magnetic field, a second time section applying, to the living body, a readout magnetic field gradient having a negative polarity, a third time section detecting the nuclear magnetic resonance signal in the state of applying the readout magnetic field gradient having a positive polarity, and a fourth time section applying, to the living body, the readout magnetic field gradient having a negative polarity; (2) one-dimensional inverse Fourier transforming the nuclear magnetic resonance signal detected in the first pulse sequence to acquire a reference projection of the imaging section in the direction applying the readout magnetic field gradient of the imaging section; (3) in the state that the living body breathes, repeating the first pulse sequence at predetermined repetition time intervals; (4) one-dimensional inverse Fourier transforming the nuclear magnetic resonance signal detected in the first pulse sequence of the (3) to acquire a projection in the direction applying the readout magnetic field gradient of the imaging section; (5) determining a similarity coefficient between the projection acquired in the (4) and the reference projection; (6) determining a predetermined threshold value from frequency of appearance of the similarity coefficient; (7) in the state that the living body breathes, executing once the first pulse sequence and in the state that the living body breathes, executing a second pulse sequence repeating, at the predetermined repetition time intervals, a pulse sequence having a fifth pulse sequence applying, to the living body, the slice select magnetic field gradient having a positive polarity and the radiofrequency magnetic field, a sixth time section applying, to the living body, respective magnetic field gradients of a phase-encoding magnetic field and a readout magnetic field gradient having a negative polarity, a seventh time section detecting the nuclear magnetic resonance signal in the state of applying the readout magnetic field gradient having a positive polarity, and an eighth time section applying, to the living body, the phase-encoding magnetic field gradient having the opposite polarity of the polarity of the phase-encoding magnetic field gradient applied in the second time section and the readout magnetic field gradient having a negative polarity, by changing the magnitude of the phase-encoding magnetic field gradient; (8) one-dimensional inverse Fourier transforming the nuclear magnetic resonance signal detected in the first pulse sequence of the (7) to acquire a projection in the direction applying the readout magnetic field gradient of the imaging section; (9) determining the similarity coefficient between the projection acquired in the (8) and the reference projection; (10) collecting the nuclear magnetic resonance signals used for the image reconstruction in the second pulse based on comparison of a value of the similarity coefficient determined in the (9) with the predetermined threshold value; and (11) repeating the (7) to the (10).

19) The inspection method using nuclear magnetic resonance according to the 18), further has the step of collecting the nuclear magnetic resonance signals used for the image reconstruction in the second pulse sequence when a value of the similarity coefficient is larger than the predetermined threshold value.

20) An inspection method using nuclear magnetic resonance having the steps of applying a radiofrequency magnetic field and a magnetic field gradient to a living body placed in a static magnetic field to detect a nuclear magnetic resonance signal produced from the living body and using the detected nuclear magnetic resonance signal to perform image reconstruction of an imaging section, has the steps of: (1) executing a first pulse sequence detecting the nuclear magnetic resonance signal to acquire a reference projection of an imaging section as the reference of monitoring of heartbeat of the living body; (2) executing once the first pulse sequence detecting the nuclear magnetic resonance signal to acquire a projection of the imaging section used for the monitoring and repeating a second pulse sequence detecting the nuclear magnetic resonance signal to acquire an image of the imaging section at predetermined repetition time intervals; and (3) collecting the nuclear magnetic resonance signals used for the image reconstruction in the second pulse sequence based on a similarity coefficient between the projection and the reference projection.

BRIEF DESCRIPTION OF THE DRAWINGS

FIGS. 6(A) to 6(C) are diagrams showing the breathing monitoring result of an embodiment of the present invention;

FIG. 7 is a diagram of assistance in explaining an example of an actual echo-acquiring sequence according to the present invention;

DETAILED DESCRIPTION OF THE PREFERRED EMBODIMENTS

An embodiment of the present invention will be described below in detail with reference to the drawings.

Figure 3:
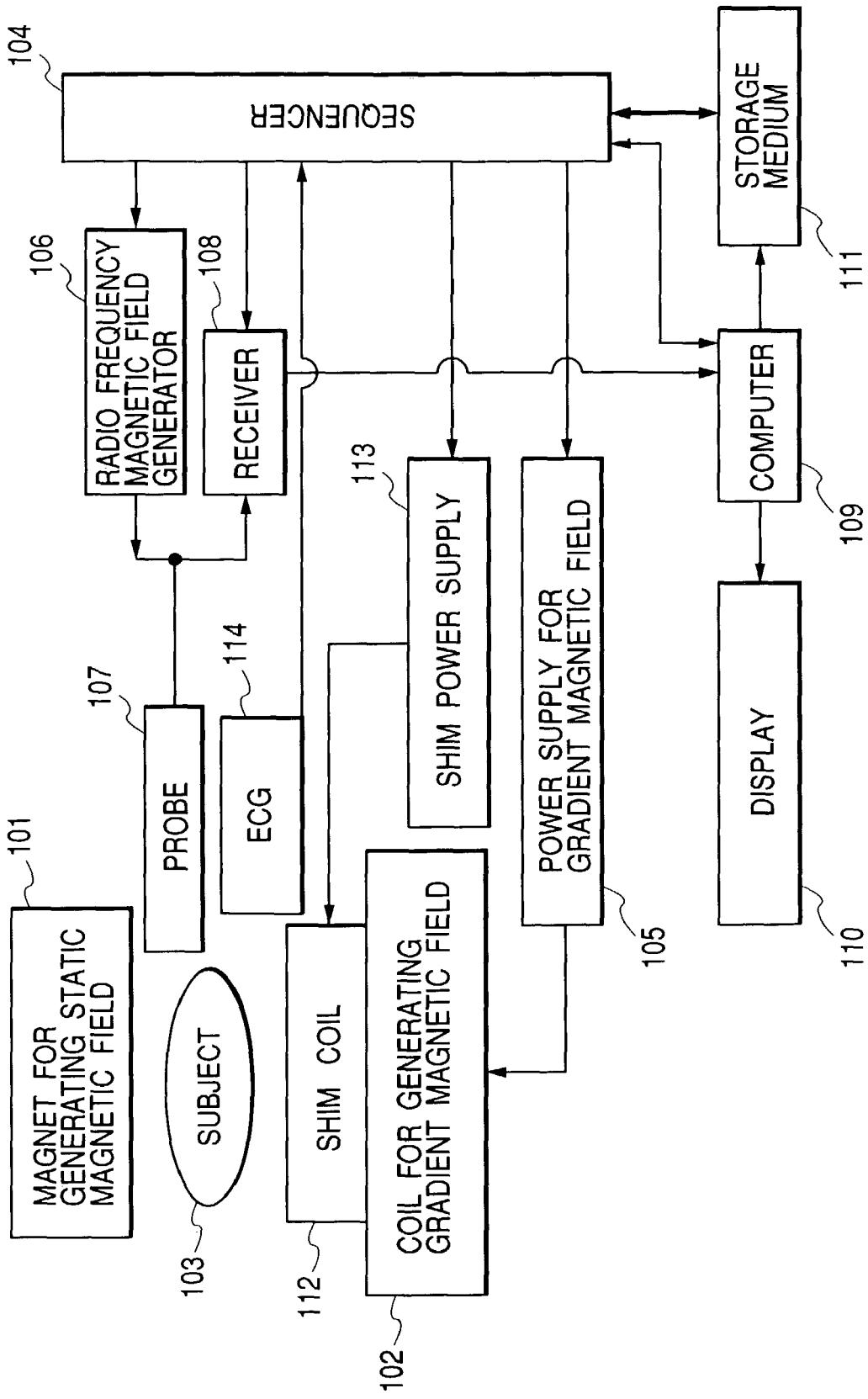
FIG. 3 is a diagram showing a construction example of a nuclear magnetic resonance imaging apparatus to which the present invention is applied.

FIG. 3 is a block diagram showing the schematic construction of a nuclear magnetic resonance imaging apparatus. In FIG. 3, the numeral 101 denotes a magnet for generating static magnetic field; the numeral 102, a coil for generating magnetic field gradient; and the numeral 103, a subject (living body). The subject 103 is placed in a static magnetic field space generated by the magnet 101. A sequencer 104 sends a command to a power supply for magnetic field gradient 105 and a radio frequency magnetic field generator 106 to generate a magnetic field gradient and a radiofrequency magnetic field, respectively. The radiofrequency magnetic field is applied via a probe 107 to the subject 103. A signal produced from the subject 103 is received by the probe 107 to be detected by a receiver 108. A nuclear magnetic resonance frequency as the reference of detection (hereinafter, referred to as a detection reference frequency) is set by the sequencer 104. The detected signal is sent to a computer 109 to perform signal processing such as image reconstruction therein.

The result is displayed on a display 110. When necessary, the detected signal and measurement conditions can also be stored into a storage medium 111. An ECG 114 connected to the sequencer 104 is in the static magnetic field space so as to measure an ECG of the subject 103. The measured ECG is fetched into the sequencer 104. When static magnetic field uniformity must be adjusted, shim coils 112 are used. The shim coils 112 are constructed by plural channels to which an electric current is supplied from a shim power supply 113. When adjusting the static magnetic filed uniformity, an electric current flowed to the shim coils is controlled by the sequencer 104. The sequencer 104 sends a command to the shim power supply 113 to generate an additional magnetic field to correct static magnetic field non-uniformity from the coils 112.

The sequencer 104 generally performs control so that the respective units are operated at programmed timing and intensity. The program into which the timing and intensity of the radiofrequency magnetic field, magnetic field gradient and signal reception are described is called a pulse sequence.

Respiratory monitoring according to the present invention is performed by calculating a similarity coefficient between a reference projection of an imaging section and a projection acquired during monitoring. The similarity coefficient is a coefficient expressing the similarity of two projections. It is 1 when the two projections are the same and is monotonously reduced as the similarity is lowered.

The respiratory motion of a subject is cyclic. When the phase of breathing during monitoring is close to the phase of breathing at acquiring a reference projection, a similarity coefficient is close to 1 and is smaller as it is away from the phase of breathing of the reference projection. When a reference projection is acquired in the state of breathing in (at inspiration), a similarity coefficient during monitoring is gradually larger at inspiration to be close to 1 and is gradually smaller at exhalation. When a reference projection is acquired in the state of breathing out (at exhalation), a similarity coefficient during monitoring is gradually larger at exhalation to be close to 1 and is gradually smaller at inspiration.

As the similarity coefficient, a linear correlation coefficient can be used. The value of points of a reference projection is $x_i$, and the value of points of a projection acquired during monitoring is $y_i$. Linear correlation coefficient $r_1$ when i is 1, ..., N is given by the following formula.

$$r_1 = \frac{\sum_i (x_i - \bar{x})(y_i - \bar{y})}{\sqrt{\sum_i (x_i - \bar{x})^2} \sqrt{\sum_i (y_i - \bar{y})^2}} \quad (1)$$

where $\bar{x}$ is an average of $x_i$ and $\bar{y}$ is an average of $y_i$.

Alternately, using inner product a given by the following formula, $$a = |\vec{x}||\vec{y}|\cos\theta = \sum_i x_i y_i \quad (2)$$

where $\vec{x}$ and $\vec{y}$ are vectors having $x_i$ and $y_i$ as components, respectively, and $\theta$ is an angle of $\vec{x}$ and $\vec{y}$ Approximately, $r_2$ expressed by the following formula may be used.

$$r_2 = \cos\theta = \frac{\sum_i x_i y_i}{|\vec{x}||\vec{y}|} \quad (3)$$

The integrated value of the intensity of a projection is hardly changed by breathing. When two projections are considered to be multidimensional vectors, whether the projections are similar can be expressed depending on that the orientations of the vectors are close to each other. The similarity can be concluded to be $r_2$.

Using either coefficient, when the two projections are the same, a coefficient is 1. As the similarity is lowered, the coefficient is smaller.

In general, there is a significant difference between the motion at inspiration in breathing in a rest state and the motion of deep breathing. As compared with this, a difference between exhalation in a rest state and exhalation at the end of breathing out is small. The degree of freedom of the depth of deep breathing is large. The degree of freedom of exhalation is small. A projection at exhalation is used for a reference projection of breathing monitoring, which tends to obtain a more stable result.

Figure 4:
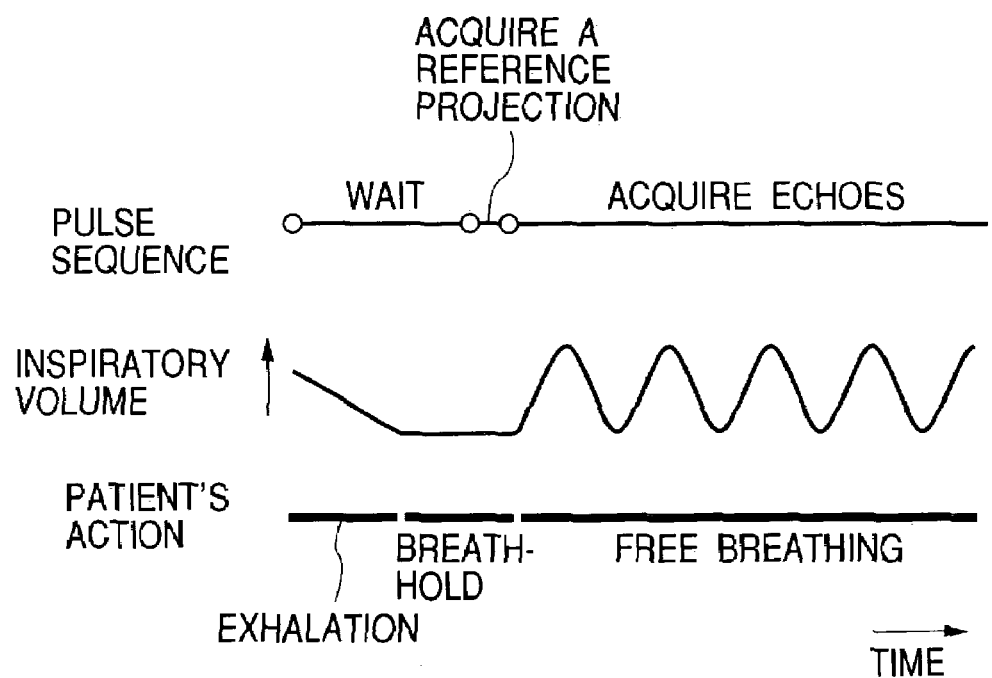
FIG. 4 is a diagram showing echo-acquiring timing of an embodiment of the present invention.

The relation between breathing and the operation of the sequencer when monitoring respiratory motion of a subject by the imaging apparatus of FIG. 3 is shown in FIG. 4. The subject breathes out slowly and stops breathing at the end of it. During stopping breathing, the sequencer executes the pulse sequence shown in FIG. 5 to measure one echo which is then one-dimensional inverse Fourier transformed. The acquired projection is a reference projection.

Figure 5:
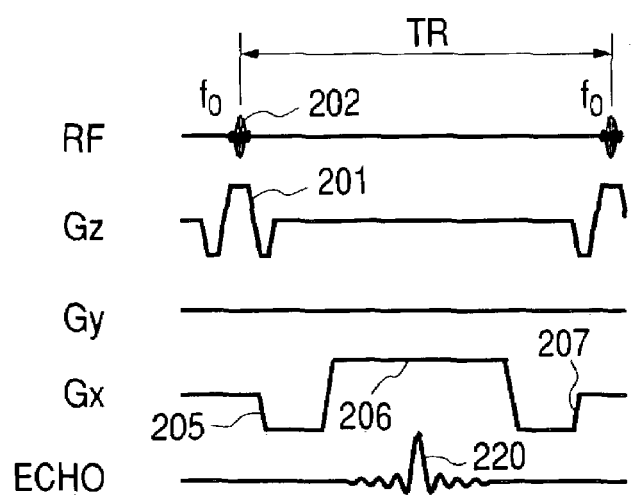
FIG. 5 is a diagram of assistance in explaining the basic form of a pulse sequence of an embodiment of the present invention.

FIG. 5 shows the basic form of a pulse sequence for acquiring breathing monitoring information by the imaging apparatus of FIG. 3 according to the present invention. The pulse sequence is in a form that the phase-encoding pulse (Gy pulse) is removed from the pulse sequence of FIG. 1. An echo 220 measured by the pulse sequence is one-dimensional inverse Fourier transformed to acquire a projection of an imaging section in a readout direction (Gx direction).

The sequencer executes the sequence of FIG. 5 at fixed time intervals after acquiring a reference projection to create a projection. The computer calculates a linear correlation between the projection and the previously acquired reference projection. During this, a subject performs general breathing.

When acquiring the reference projection, measurement of one echo is generally sufficient. When including a heart in an echo-acquired section, a projection is largely changed by heartbeat. In this case, the pulse sequence of FIG. 5 is executed repeatedly to measure plural echoes. The echoes for one heartbeat are averaged to remove the influence of the heartbeat. When a reference projection is acquired by averaging and individual projections during monitoring are influenced by heartbeat so that a linear correlation coefficient is not stable, a moving average of the linear correlation coefficients is calculated to enable stable monitoring.

FIG. 6 shows an example of an tomographic image acquired by actual measurement and linear correlation coefficients. As shown in FIG. 6(A), the image shows the transverse section of a chest, the right and left directions (the up-and-down direction on the sheet in the drawing) of the transverse section is a readout direction, and a project direction is vertical to the readout direction (in the right-and-left direction on the sheet in the drawing). The projection shown in FIG. 6(B) is acquired for 30 seconds at 80 milliseconds intervals. The graph of the linear correlation coefficients (similarity coefficients) shown in FIG. 6(C) shows the result of a moving average of 15 linear correlation coefficients. From the graph, the change in the linear correlation coefficient in synchronization with breathing of a subject can be read. The linear correlation coefficient is close to 1 at exhalation and is smaller at inspiration. It is found that respiratory motion of the subject can be monitored using the linear correlations.

A method for acquiring an image without motion artifact while monitoring breathing in real time by the above method will be described. In general, the stop period of motion at exhalation is longer than that at inspiration. In this method, echoes are measured only in a period in which breathing of a subject is decided to be exhalation to reconstruct an image.

Figure 1A:
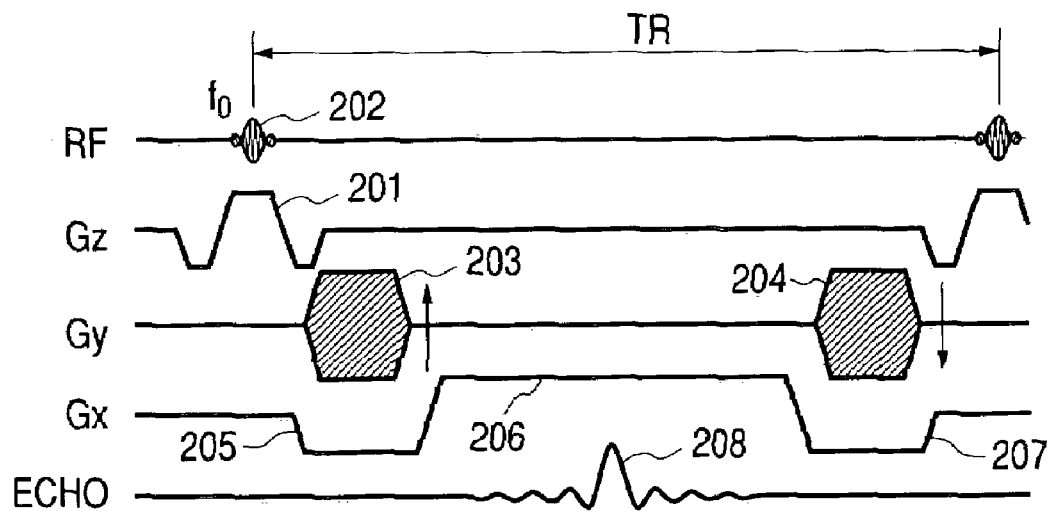
FIGS. 1(A) to 1(B) are diagrams showing a pulse sequence of a GE method of a prior art.
Figure 1B:
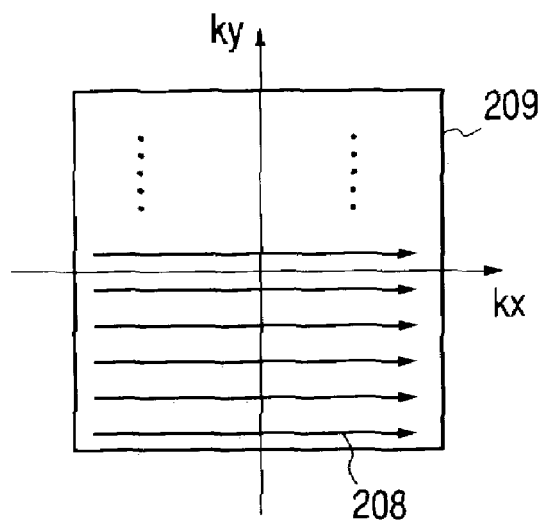
Figure 2A:
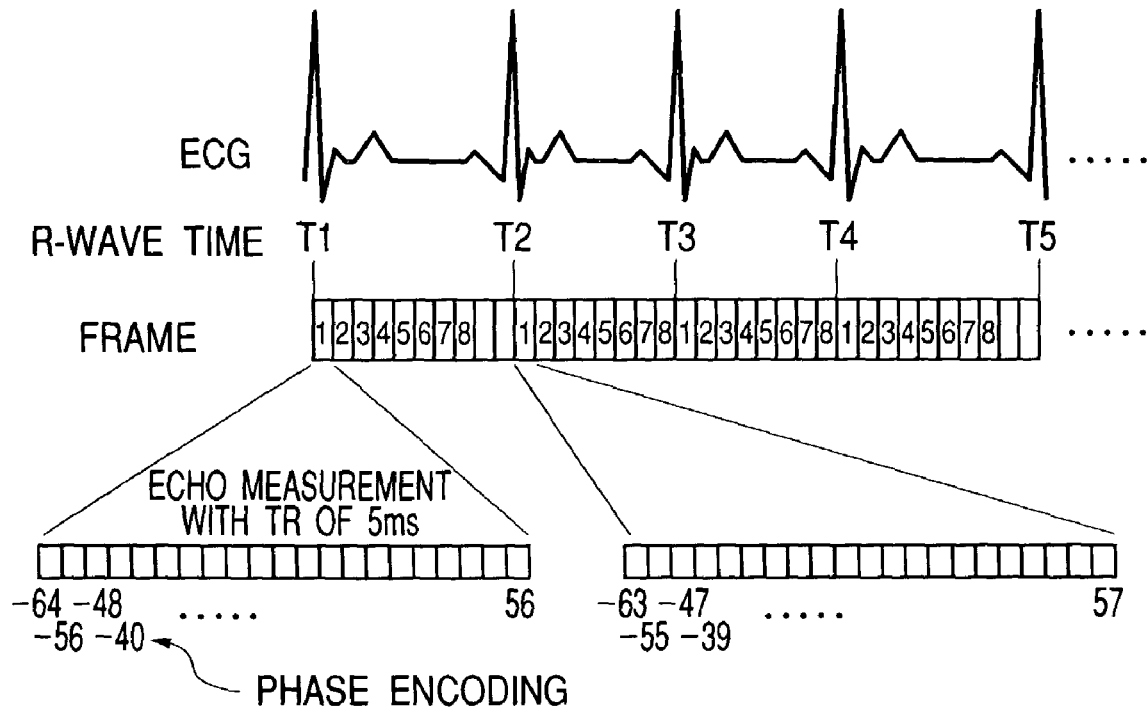
FIGS. 2(A) to 2(B) are diagrams of assistance in explaining ECG gating of a prior art.
Figure 2B:
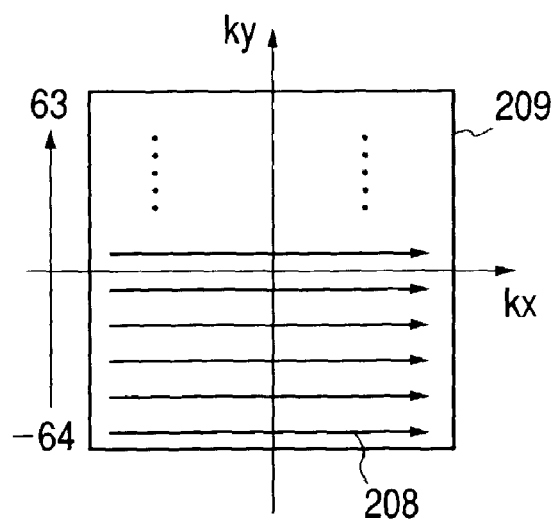

As shown in FIG. 7, as an actual pulse sequence, each time pulse sequence B of FIG. 1 is executed n times, pulse sequence A of FIG. 5 is executed once. n depends on TR and the time resolution of breathing monitoring. For example, when at TR of 5 ms, the time resolution of breathing monitoring is 80 ms, n is 15.

Figure 8:
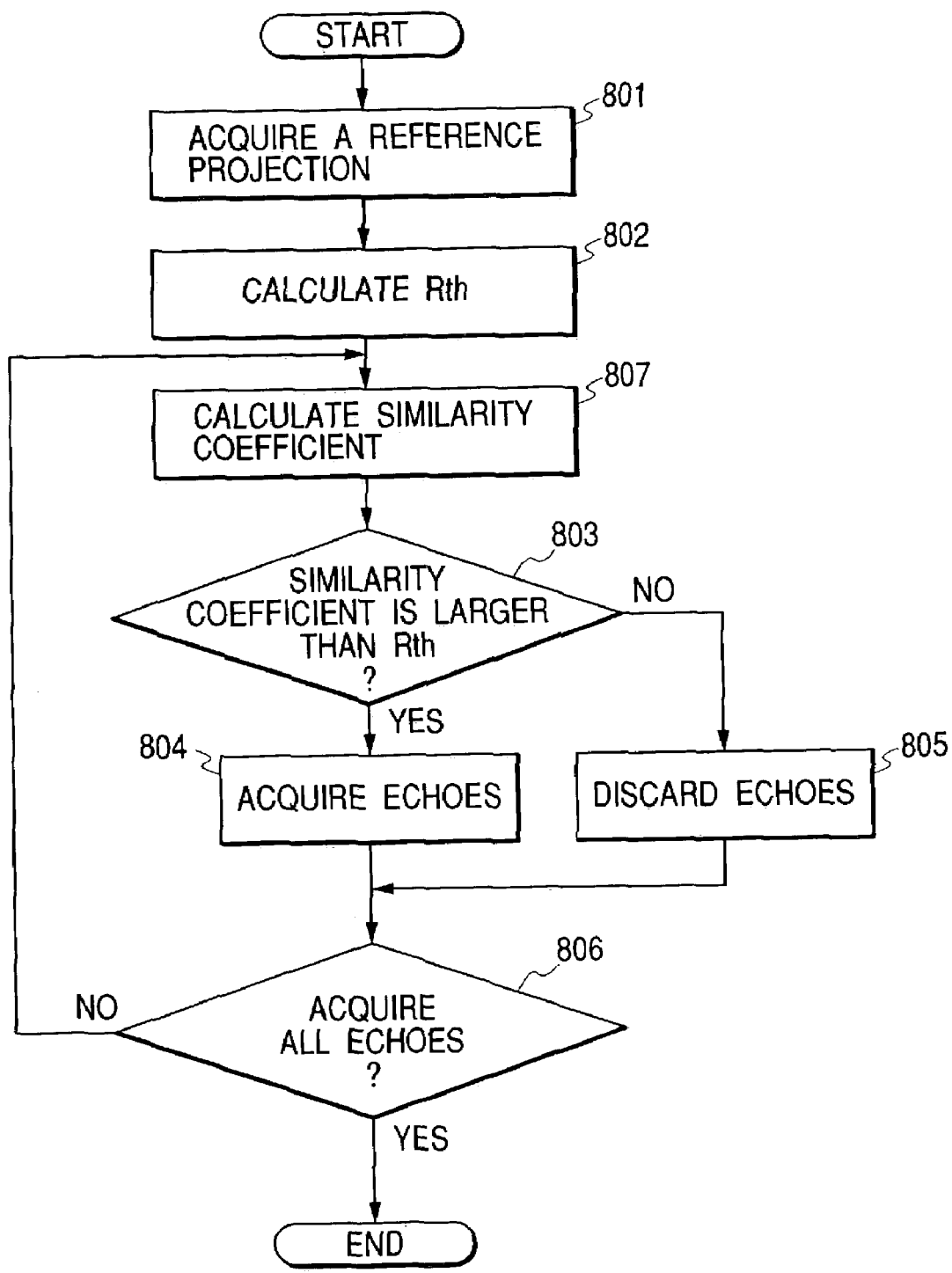
FIG. 8 is a diagram showing an echo-acquiring flow according to the present invention.
Figure 9:
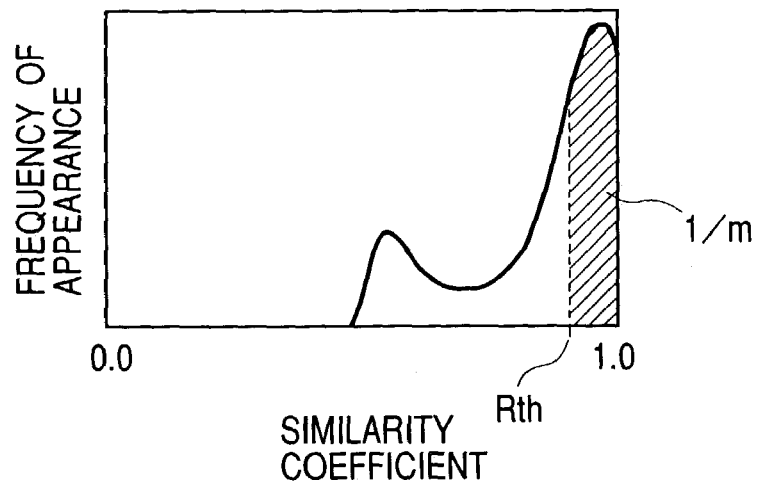
FIG. 9 is a diagram showing a threshold value determining method according to the present invention.

An echo-acquiring flow will be described according to FIG. 8. As pulse preparation, the echo-acquiring sequence of FIG. 5 is used to acquire a projection at exhalation or inspiration of a subject, creating a reference projection (step 801). The case of using the projection at exhalation will be described below.

The pulse sequence of FIG. 7 is executed to estimate a change in the linear correlation of respiratory motion of the subject. In other words, the pulse sequence of FIG. 7 is executed to calculate a linear correlation between the projection acquired in first half part A and the reference projection. This is executed for sufficient time (for example, for 30 seconds) to create a histogram of the calculated linear correlations. From this histogram, there is determined linear correlation value Rth in which frequency of appearance of a part in which the linear correlation is close to 1 is 1/m (m is a positive number) of the entire frequency of appearance (step 802). During this, echoes acquired in latter half part B of the pulse sequence are discarded.

In the later measurement, the pulse sequence of FIG. 7 is used to acquire a tomographic image of the subject while monitoring breathing. The A is executed to acquire a projection to calculate a linear correlation coefficient between it and the reference projection (step 807). When the value is larger than the Rth, exhalation is decided (step 803). Only in this case, echoes for image reconstruction are measured (step 804). When not deciding exhalation, the sequence is executed and echoes are discarded or not measured (step 805). This is continued until echoes necessary for image reconstruction are acquired (step 806).

The magnitude of the influence of motion to image reconstruction depends on the m. As the m is larger, the influence of motion is smaller and an image having good quality can be acquired. In general, when the m is 3 or above, sufficient image quality can be acquired.

Figure 10:
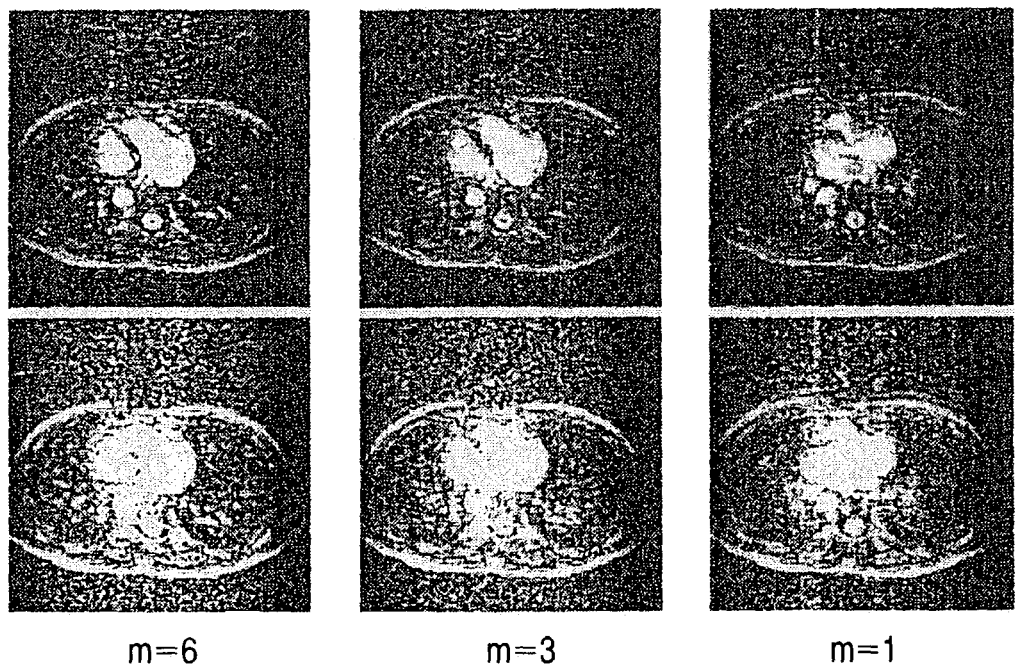
FIG. 10 is a diagram showing echo-acquired results according to the present invention.

FIG. 10 shows the echo-acquired results of the transverse section of the chest at m of 6, 3 and 1. Blurring caused when not using breathing monitoring (m of 1) is found to be suppressed when m of 3 and 6. As the m is larger, the image quality is better.

A method for monitoring motion (heartbeat) of a heart using the linear correlation coefficient of a projection will be described. For heartbeat monitoring, a projection created from one echo acquired immediately after R wave as a reference projection is used. As a linear correlation coefficient acquired during monitoring, a value close to 1 immediately after the R wave can be obtained. Unlike the breathing monitoring, generally, a moving average need not be calculated. When monitoring only heartbeat without performing breathing monitoring, breath-hold need not be performed when acquiring the reference projection.

Figure 11:
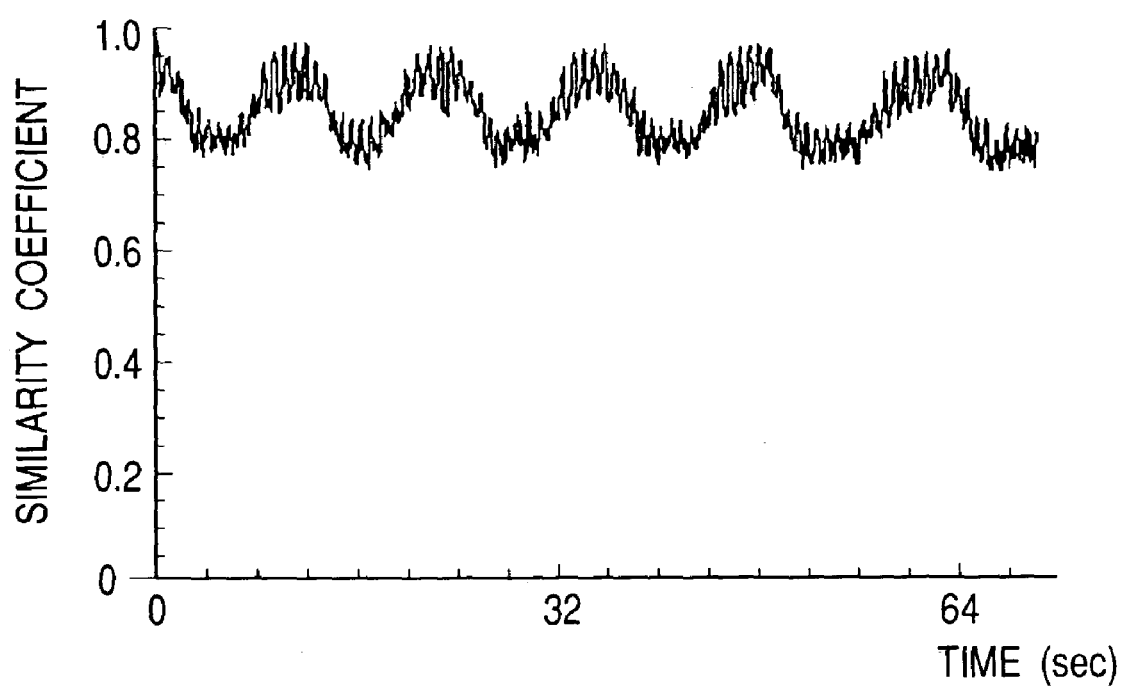
FIG. 11 is a diagram of assistance in explaining linear correlation coefficients according to the present invention.

FIG. 11 is a graph showing the case that the change in the linear correlation coefficients in which a moving average is not calculated, acquired as in FIG. 6(C) using the reference projection created from one echo acquired immediately after the R wave. In this case, the linear correlation coefficient is changed in a slow period according to respiratory motion and the linear correlation coefficient is instantly large in a short period according to heartbeat. Since the reference projection is created from the echo immediately after the R wave, the time at which the linear correlation coefficient is instantly large coincides with the R wave. The data is used to detect peak positions to detect the R wave, monitoring heartbeat.

Figure 12A:
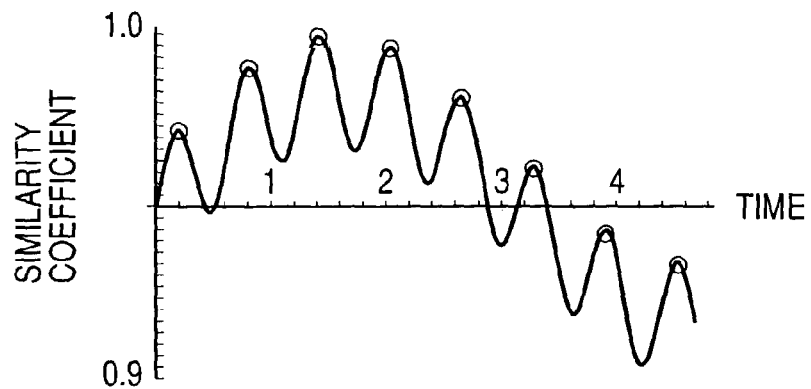
FIGS. 12(A) to 12(C) are diagrams showing a heartbeat monitoring method according to the present invention.
Figure 12B:
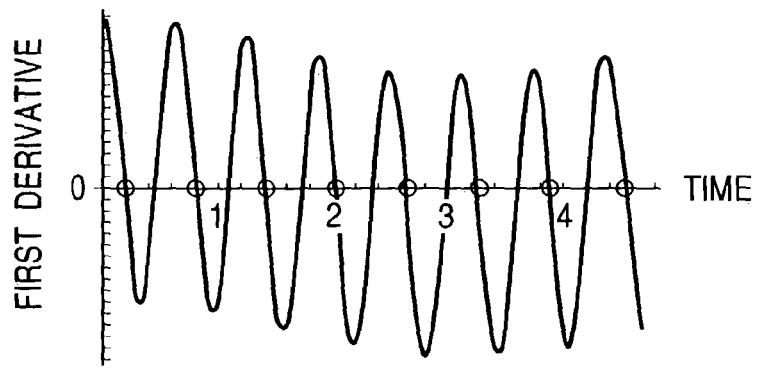
Figure 12C:
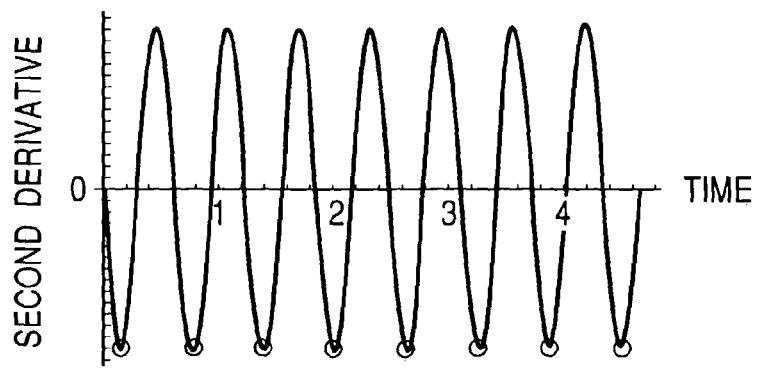

The peak positions can be detected as positions in which a first derivative of the graph of FIG. 11 is 0 and a second derivative is negative. FIG. 12(A) is a graph enlarging part of FIG. 11 (The peak positions are indicated by ○ in the drawing). FIGS. 12(B) and 12(C) show the first derivative result and the second derivative result of FIG. 12(A). From the drawings, the peak positions coincide with the positions in which a first derivative is 0 and a second derivative is negative.

Using this method, heartbeat can be monitored without using an ECG. The operation of the case of executing this in the apparatus of FIG. 3 is as follows.

As shown in FIG. 4, the subject breathes out slowly and stops breathing at the end of it. During that, the sequencer executes the pulse sequence of FIG. 5 to measure one echo. A projection acquired by one-dimensional inverse Fourier transforming this is a reference projection. Thereafter, the subject performs general breathing. The sequencer executes the pulse sequence of FIG. 5 at fixed time intervals to create a projection. The computer calculates a linear correlation between the projection and the previously acquired reference projection. A peak position is detected by the above-described method. When detecting the peak, the computer sends a trigger of the R wave to the sequencer. The sequencer uses the trigger as a substitute for a trigger from an ECG of the prior art. For example, in the case of cardiac imaging using ECG gating described in the prior art, phase encoding is changed in synchronization with the trigger.

Using the heartbeat monitoring according to the present invention as a substitute for an ECG, trouble for putting on an ECG before inspection can be eliminated to improve the inspection throughput.

In the above-described embodiment, a reference projection is acquired before the echo-acquiring sequence of a projection. In the present invention, a reference projection may be acquired after terminating the echo-acquiring sequence of a projection. In this case, however, all echoes are measured and stored to calculate a similarity coefficient in post-processing, selecting the echoes according to this. The number of echoes measured and stored is m times the number necessary for reconstruction.

As described above in detail, according to the present invention, an echo in an exhalation period can be acquired. A significant effect of suppressing blurring of an image caused by respiratory motion can be achieved. In addition, heartbeat is monitored by the present invention. An ECG need not be put on and diagnosis can be conducted more simply.

The present invention can realize an inspection apparatus using nuclear magnetic resonance which can execute multi-slice and multi-frame cardiac imaging without giving any load on a subject.

What is claimed is:

1. An inspection apparatus using nuclear magnetic resonance comprising:
   a controller for controlling a pulse sequence which applies a radiofrequency magnetic field and a magnetic field gradient to a living body placed in a static magnetic field to detect a nuclear magnetic resonance signal produced from said living body; and
   an arithmetic processor for performing an image reconstruction of an imaging section using said detected nuclear magnetic resonance signal,
   wherein said controller is configured to:
     (1) control application of a first pulse sequence detecting said nuclear magnetic resonance signal when said living body stops exhalation or inhalation;
     (2) control application of said first pulse sequence once in a state that said living body breathes; and
     (3) control of repeated application of a second different pulse sequence for detecting said nuclear magnetic resonance signal at predetermined repetition time intervals,
   wherein said arithmetic processor is configured to:
     (a) perform arithmetic processing of acquiring a reference projection of said imaging section from said nuclear magnetic resonance signal detected in said first pulse sequence when said living body stops exhalation or inhalation;
     (b) perform arithmetic processing of acquiring a projection of said imaging section from said nuclear magnetic resonance signal detected in said first pulse sequence when said living body breathes; and
     (c) perform arithmetic processing of determining a similarity coefficient between said projection and said reference projection, said similarity coefficient being scalar,
   wherein said controller is further configured to (4) collect or discard said nuclear magnetic resonance signals from said second pulse sequence based on said similarity coefficient, and reconstructing said image using the collected nuclear magnetic resonance signals, and
   wherein said projection is one-dimensional, and said reference projection is one-dimensional.

2. The inspection apparatus using nuclear magnetic resonance according to claim 1, wherein said controller is programmed to control repeating of said (2) to said (3), and collecting of said nuclear magnetic resonance signals used for said image reconstruction in said second pulse sequence based on comparison of a value of said similarity coefficient with a predetermined threshold value.

3. The inspection apparatus using nuclear magnetic resonance according to claim 1, wherein:
   said controller performs said (4) when a value of said similarity coefficient is larger than a predetermined threshold value.

4. The inspection apparatus using nuclear magnetic resonance according to claim 3, wherein:
   said controller is configured to (1a) control repeated application of said first pulse sequence at said predetermined repetition time intervals in the state that said living body breathes, and
   said arithmetic processor is further configured to perform arithmetic processing of determining a frequency of appearance of said similarity coefficient between a projection of said imaging section acquired from said nuclear magnetic resonance signals detected by repeating said first pulse sequence of said (1a) and said reference projection and decides, as said predetermined threshold value, said similarity coefficient in which the sum of said frequency of appearance in a part in which said similarity frequency is close to 1 is 1/m of the sum of said frequency of appearance where m is a positive number of 3 or above.

5. The inspection apparatus using nuclear magnetic resonance according to claim 4, wherein said similarity coefficient in which the sum of said frequency of appearance in a part in which said similarity frequency is close to 1 is 1/m of the sum of said frequency of appearance where m is a positive number of 3 or above is decided as said predetermined threshold value.

6. The inspection apparatus using nuclear magnetic resonance according to claim 1, wherein a moving average of linear correlation coefficients is acquired as the similarity coefficient.

7. The inspection apparatus using nuclear magnetic resonance according to claim 1, wherein the arithmetic processor calculates a moving average of the similarity coefficients.

8. The inspection apparatus using nuclear magnetic resonance according to claim 1, wherein said controller is programmed to apply an average of projections of the imaging section acquired from the nuclear magnetic resonance signals detected by repeating the first pulse sequence as the reference projection.

9. An inspection apparatus using nuclear magnetic resonance comprising:
   a controller for controlling a pulse sequence which applies a radiofrequency magnetic field and a magnetic field gradient to a living body placed in a static magnetic field in order to detect a nuclear magnetic resonance signal produced from said living; and
   an arithmetic processor for performing an image reconstruction of an imaging section using said detected nuclear magnetic resonance signal;

wherein said controller is configured to:
  apply a first pulse sequence, during a breath-holding period, to determine a reference nuclear magnetic resonance signal,
  apply the first pulse sequence, while breathing, to determine a first nuclear magnetic resonance signal,
  apply a second different pulse sequence a predetermined number of times, while breathing, to determine a plurality of second nuclear magnetic resonance signals, and
  repeat application of the first pulse sequence while breathing and application of the second pulse sequence for a predetermined length of time, and
wherein said arithmetic processor is configured to:
  determine a reference signal corresponding to application of the first pulse sequence during the breath-holding period,
  determine a first signal corresponding to each application of the first pulse sequence while breathing,
  determine a plurality of second signals corresponding to each application of the second pulse sequence a predetermined number of times,
  compare each second signal to the reference signal,
  determine a similarity coefficient for each second signal based on comparison to the reference signal,
  save or discard second nuclear magnetic resonance signals based on a corresponding similarity coefficient, and
  reconstruct the image using the saved second nuclear magnetic resonance signals and the first nuclear magnetic resonance signals.

10. The inspection apparatus using nuclear magnetic resonance according to claim 9, wherein:
  said controller is configured to apply the first pulse sequence, during the breath-holding period, a plurality of times during one heartbeat; and
  said arithmetic processor is configured to:
    determine a plurality of reference signals corresponding to application of the first pulse sequence during the breath-holding period,
    calculate a average reference signal, and
    compare each second signal to the average reference signal.

11. The inspection apparatus according to claim 9, wherein said arithmetic processor is further configured to:
  store all the first signals and second signals determined from repeated application of the first pulse sequence and the second pulse sequence prior to comparing each second signal; and
  compare each stored second signal to the reference signal.

12. A method of creating images of an imaging section using nuclear magnetic resonance comprising the sequence independent steps of:
  applying a first pulse sequence, during a breath-holding period, to determine a reference nuclear magnetic resonance signal,
  applying the first pulse sequence, while breathing, to determine a first nuclear magnetic resonance signal,
  applying a second different pulse sequence a predetermined number of times, while breathing, to determine a plurality of second nuclear magnetic resonance signals;
  repeating the steps of applying the first pulse sequence while breathing and applying the second pulse sequence for a predetermined length of time;
  determining a reference signal corresponding to the first pulse sequence applied during the breath-holding period;
  determining a first signal corresponding to each of the first pulse sequences applied while breathing;
  determining a plurality of second signals corresponding to each of the second pulse sequences applied a predetermined number of times;
  comparing each second signal to the reference signal;
  determining a similarity coefficient for each second signal based on the step of comparing;
  saving or discarding second nuclear magnetic resonance signals based on a corresponding similarity coefficient; and
  reconstructing the image using the saved second nuclear magnetic resonance signals and the first nuclear magnetic resonance signals.

* * * * *